United States Patent
Rentschler et al.

(10) Patent No.: US 9,589,080 B2
(45) Date of Patent: Mar. 7, 2017

(54) METHOD AND CONTROL UNIT FOR VALIDATING AN ILLUMINATION-RANGE TEST VALUE OF A LIGHT CONE OF A VEHICLE HEADLIGHT

(75) Inventors: Tobias Rentschler, Pforzheim (DE); Christian Renner, Leonberg (DE)

(73) Assignee: ROBERT BOSCH GMBH, Stuttgart (DE)

( * ) Notice: Subject to any disclaimer, the term of this patent is extended or adjusted under 35 U.S.C. 154(b) by 1040 days.

(21) Appl. No.: 13/698,866

(22) PCT Filed: May 12, 2011

(86) PCT No.: PCT/EP2011/057680
§ 371 (c)(1),
(2), (4) Date: Jan. 25, 2013

(87) PCT Pub. No.: WO2011/144516
PCT Pub. Date: Nov. 24, 2011

(65) Prior Publication Data
US 2013/0158960 A1    Jun. 20, 2013

(30) Foreign Application Priority Data

May 20, 2010  (DE) .................. 10 2010 029 149

(51) Int. Cl.
*G06G 7/48* (2006.01)
*G06F 17/50* (2006.01)
(Continued)

(52) U.S. Cl.
CPC .......... *G06F 17/5009* (2013.01); *B60Q 1/10* (2013.01); *G01M 11/065* (2013.01);
(Continued)

(58) Field of Classification Search
CPC ............ G06F 17/5009; G06K 9/00798; G06K 9/00825; B60Q 1/10; G01M 11/068; G01M 11/065
(Continued)

(56) References Cited

U.S. PATENT DOCUMENTS 5,193,894 A * 3/1993 Lietar ...................... B60Q 1/10
                                                  362/276
5,751,832 A * 5/1998 Panter .................. G05B 19/401
                                                  356/121
(Continued)

FOREIGN PATENT DOCUMENTS

CN    1267039     9/2000
DE    1 964 717   7/1971
(Continued)

OTHER PUBLICATIONS

McLoughlin, Simon et al., "Classification of Road Sign Type Using Mobile Stereo Vision", 2005, Opto-Ireland 2005: Imaging and Vision, SPIE vol. 5823.*
(Continued)

*Primary Examiner* — Kamini S Shah
(74) *Attorney, Agent, or Firm* — Gerard Messina

(57) ABSTRACT

A method for validating an illumination-range test value of a light cone of at least one headlight of a vehicle. The method includes reading in a reflection intensity of a point on at least one road marking illuminated by the light cone; generating a reflection intensity model for the road marking, based on the obtained reflection intensity and a particular distance of the point from the vehicle, the reflection intensity model being designed to assign different reflection intensities to different positions on the road marking in front of the vehicle; determining an illumination-range plausibility value, at which, according to the reflection intensity model, a reflection intensity is reached, which corresponds to a
(Continued)

reflection-intensity threshold value; and comparing the illumination-range plausibility value to the illumination-range test value, to validate the illumination-range test value, if the illumination-range plausibility value is inside a tolerance range around the illumination-range test value.

5 Claims, 3 Drawing Sheets

(51) Int. Cl.
    *B60Q 1/10*          (2006.01)
    *G01M 11/06*      (2006.01)
    *G06K 9/00*        (2006.01)

(52) U.S. Cl.
    CPC ....... *G01M 11/068* (2013.01); *G06K 9/00798* (2013.01); *G06K 9/00825* (2013.01)

(58) Field of Classification Search
    USPC ...................................... 703/8, 6, 2; 382/104
    See application file for complete search history.

(56) References Cited

U.S. PATENT DOCUMENTS

| | | | |
|---|---|---|---|
| 5,796,094 A * | 8/1998 | Schofield | B60N 2/002 250/208.1 |
| 8,004,428 B2 | 8/2011 | Koenig | |
| 2002/0106109 A1 * | 8/2002 | Retterath | G08G 1/096758 382/104 |
| 2004/0032743 A1 * | 2/2004 | Dari | B60Q 1/10 362/466 |
| 2004/0042638 A1 | 3/2004 | Iwano | |
| 2005/0152581 A1 * | 7/2005 | Hoki | B60Q 1/085 382/104 |
| 2007/0253597 A1 * | 11/2007 | Utida | B60Q 1/085 382/104 |
| 2008/0117642 A1 * | 5/2008 | Moizard | B60Q 1/085 362/466 |
| 2009/0041303 A1 * | 2/2009 | Aoki | G06K 9/00798 382/104 |
| 2010/0014713 A1 | 1/2010 | Zhang et al. | |
| 2010/0214791 A1 * | 8/2010 | Schofield | B60Q 1/1423 362/466 |
| 2011/0069303 A1 | 3/2011 | Mehr et al. | |

FOREIGN PATENT DOCUMENTS

| | | | |
|---|---|---|---|
| DE | 4 122 531 | 1/1993 | |
| DE | EP 0949118 A2 * | 10/1999 | ............. B60Q 1/085 |
| DE | 199 16 175 | 10/2000 | |
| DE | 19916175 A1 * | 10/2000 | ............. B60Q 1/085 |
| DE | 103 11 240 | 9/2004 | |
| DE | 10 2005 033 641 | 1/2007 | |
| DE | EP 2050618 A2 * | 4/2009 | ............. B60Q 1/10 |
| DE | 10 2008 031 159 | 1/2010 | |
| DE | EP 2147823 A1 * | 1/2010 | ............. B60Q 1/143 |
| EP | 0 949 118 | 10/1999 | |
| EP | 2 050 618 | 4/2009 | |
| EP | 2 147 823 | 1/2010 | |
| FR | 2 661 248 | 10/1991 | |

OTHER PUBLICATIONS

Borkar, Amol et al., "A Layered Approach to Robust Lane Detection at Night", 2009, IEEE.*
International Search Report, PCT International Application No. PCT/EP2011/057680, dated Aug. 30, 2011.

* cited by examiner

METHOD AND CONTROL UNIT FOR VALIDATING AN ILLUMINATION-RANGE TEST VALUE OF A LIGHT CONE OF A VEHICLE HEADLIGHT

FIELD OF THE INVENTION

The present invention relates to a method for validating an illumination-range test value of a light cone, a method for controlling a variable illumination range system, a control unit and a computer program product.

BACKGROUND INFORMATION

Today, systems for detecting, e.g., white and/or yellow road markings based on monocular or stereo video cameras, are mass-produced. The functional principle is based on detecting the differences in contrast between the road-surface covering and the marking and generating the information about the lines from them. Such systems are described, for example, in German Patent Application Nos. DE10311240A1 and DE102005033641A1.

SUMMARY

The present invention provides an example method for validating an illumination-range test value of a light cone of at least one headlight of a vehicle, a method for controlling a variable illumination range system of the vehicle, furthermore, a control unit that utilizes this method, and finally, a corresponding computer program product. Advantageous refinements are derived from the description below.

The present invention provides an example method for validating an illumination-range test value of a light cone of at least one headlight of a vehicle, the example method having the following steps: reading in a reflection intensity of a point on at least one road marking illuminated by the light cone; generating a reflection intensity model for the road marking, based on the obtained reflection intensity and a particular distance of the point from the vehicle, the reflection intensity model being designed to assign different reflection intensities to different positions on the road marking in front of the vehicle; determining an illumination-range plausibility value, at which, according to the reflection intensity model, a reflection intensity on the road marking is reached, which corresponds to a reflection-intensity threshold value; and comparing the illumination-range plausibility value to the illumination-range test value, in order to validate the illumination-range test value, and in particular, to then validate the illumination-range test value, if the illumination-range plausibility value is inside a tolerance range around the illumination-range test value.

The present invention also provides an example device for validating an illumination-range test value of a light cone of at least one headlight of a vehicle, the example device including the following steps: a unit for reading in a reflection intensity of a point on at least one road marking illuminated by the light cone; a unit for generating a reflection intensity model for the road marking, based on the obtained reflection intensity and a particular distance of the point from the vehicle, the reflection intensity model being designed to assign different reflection intensities to different positions on the road marking in front of the vehicle; a unit for determining an illumination-range plausibility value, at which, according to the reflection intensity model, a reflection intensity is reached, which corresponds to a reflection-intensity threshold value; and a unit for comparing the illumination-range plausibility value to the illumination-range test value, in order to validate the illumination-range test value, and in particular, to then validate the illumination-range test value, if the illumination-range plausibility value is inside a tolerance range around the illumination-range test value.

Using the method set forth here, for example, it may be checked if, on a road at night, other road users are blinded by the headlights of the reference vehicle. The validation may be accomplished, for example, by comparing the illumination-range test value to a further value, in order to check, for example, based on the illumination-range test value, if the light cone of the at least one headlight is set in such a manner, that, first of all, neither a vehicle driving ahead, nor an oncoming vehicle is blinded, and secondly, as large a portion as possible of a surrounding area of the vehicle is illuminated by the light cone. The illumination-range test value may be determined, for example, by a variable illumination range system of the vehicle and indicated as a distance in meters from the vehicle. Therefore, the illumination-range test value constitutes a distance value, which is measured or provided by a system that is dependent on the system for validation described here. The illumination-range test value may designate, for example, a distance of a vehicle driving ahead, the distance being determined by a distance-measuring system in light of, e.g., detected tail lights of the vehicle driving ahead. The validation may be accomplished, for example, with the aid of a special algorithm. The illumination-range test value may represent, e.g., a terminal edge of the light cone and may be changed, for example, using an inclination of the vehicle headlights. The light cone may be formed, for example, by the two headlights of the vehicle and may illuminate a road situated in front of the vehicle, as well as a portion of a surrounding area of the vehicle. For example, the detection may be carried out optically, using a camera or a sensor of the vehicle. The reflection intensity may describe, e.g., the intensity at which the light of the headlights is reflected onto the detection unit, and may be indicated in Lux, for example. The reflecting point on the road marking may be created, for example, by a quartz granule or another element that is a component of the road marking. The road marking may be one of the white or yellow, solid or broken lines at the edge and/or in the middle of a road, which define the lanes for the vehicles.

Therefore, a reflection intensity may be understood, for example, as a light intensity, which is detected or read in by an optical detector, such as a camera, after a headlight illuminates a particular position of the road marking. The reflection intensity model may be a mathematical model, which forms a graph via interpolation of the plurality of points; the graph assigning, to each point on the road marking covered by the light cone, a corresponding reflection intensity and a corresponding distance from the vehicle. For example, the graph may have the shape of a second-order or higher-order parabola. In particular, the reflection intensity model may represent a concrete function made up of a pair of functions, which is determined using the obtained reflection intensity of the point.

Consequently, different positions on the road marking in front of the vehicle may be assigned different reflection intensities by the reflection model. The different positions may be represented by different points on the road marking, which are each at another, i.e., different, distance from the vehicle. The illumination-range plausibility value may be determined with the aid of the reflection intensity model and, as in the case of the illumination-range test value, may also be expressed as the distance in meters from the vehicle. In this context, the illumination-range plausibility value also represents, for example, a distance value, which corresponds to a distance in front of the vehicle, at which distance the light intensity according to the reflection model corresponds to the threshold reflection value. The reflection-intensity threshold value may represent a particular luminescent or light intensity value and be predetermined, for example, by a type of headlight used in the vehicle, and may be mathematically portrayed, for example, by a sectional plane or a straight line through the graph of the reflection intensity model. In this context, e.g., an intersection of the sectional plane with the graph may correspond to the reflection-intensity threshold value. The step of comparing may be carried out, for example, using a suitable algorithm. The tolerance range around the illumination-range test value may represent a range around the illumination-range test value, which has configurable and/or parameterizable limits.

The present invention is based, in particular, on detecting an intensity of light reflections on road markings, which are emitted, for example, by the headlights of a vehicle. If one combines this line intensity measurement with a mathematical reflection model, then a distance of an illumination from the vehicle up to the end of the light cone may be determined.

A further aspect of the present invention is a use of this information for validating a current control performance of a variable illumination range system (VIR control performance).

According to the approach set forth here, in particular, an illumination reliability of a controlled light may be improved. In VIR functions (VIR=variable illumination range), it is important to ensure that under all circumstances, other road users, e.g., a vehicle driving ahead, are not blinded by the illumination. Therefore, conventional VIR systems are designed very conservatively. Using the approach explained here, VIR systems may be designed to be considerably more reliable, which may result in markedly improved illumination conditions. Thus, an additional aspect of the approach of the present invention consists in countervalidating the illumination range with the aid of a second independent characteristic, the line reflections, and thereby verifying the illumination range.

According to one specific embodiment, the illumination-range test value may be determined based on the monitoring of an object situated in the light cone. The object may be, for example, a vehicle driving ahead or an oncoming vehicle. The illumination-range test value may be determined, for example, based on the detection of the bumper or tail lights of the vehicle driving ahead or oncoming vehicle. The detection may be accomplished, for example, using a camera of the vehicle.

In addition, in the reading-in step, the reflection intensity may be read in at the point on the road marking, at which point the reflection intensity is at its maximum, when viewed over all of the points on the road marking. This produces the advantage that the value determination, which is based on the reflection intensity model and is for validating the illumination-range test value, may be designed to be more robust.

Furthermore, in the reading-in step, the reflection intensity of a point may be obtained, which is situated on the longest of a plurality of road markings illuminated by the light cone. The use of the longest road marking offers the advantage that based on the reflection intensity model, a greater bandwidth of reflection intensity values having finer incrementation may be available, which means that the illumination-range plausibility value is determined considerably more accurately, and accordingly, the validation of the illumination-range test value may be determined so accurately, that even the smallest deviations may be detected.

According to one specific example embodiment, a reflection-intensity threshold value, which is a function of a type of headlight used in the vehicle, may be used in the determining step. Thus, the method proposed here may be advantageously applied in many ways, since it may easily be adapted to many different conventional types of headlight. In addition, the types of headlight are known in the case of implementing the method in the specific vehicle.

The present invention further provides a method for controlling a variable illumination range system of the vehicle, the method having the following steps: the steps according to one of the preceding claims, for obtaining a validated illumination-range test value; and controlling the variable illumination range system based on the validated illumination-range test value.

The variable illumination range system, abbreviated as VIR system, may be, for example, an intelligent light assistant of a vehicle, which may be used for controlling the illumination range of the vehicle headlights in such a manner, that they may be continuously adapted to a traffic situation caused by vehicles driving ahead and/or oncoming vehicles. This may be accomplished, e.g., in that the system ascertains and provides an illumination-range test value, which is based on the detection of a bumper and/or of tail lights or headlights of the other vehicles. Using the illumination-range test value, e.g., an inclination of the vehicle headlights may be set, so that occupants of the vehicles driving ahead and/or oncoming vehicles are not blinded. The control may be carried out, for example, with the aid of a closed loop, using a suitable algorithm. The above-described method for validating an illumination-range test value, and the control of the VIR system, may be implemented using the same or different components, e.g., cameras and/or control units, of the vehicle.

The present invention also provides a control unit that is configured to carry out or implement the steps of the method according to the present invention. In particular, the control unit may have devices, which are configured to execute one step of the method, each. An object of the present invention may also be achieved quickly and efficiently by this embodiment variant of the present invention in the form of a control unit.

In the case at hand, a control unit or a device may be understood as an electrical device that processes sensor signals and outputs control signals as a function thereof. The control unit may have an interface, which may be implemented as hardware and/or software. In a hardware implementation, the interfaces may, for example, be part of a so-called system ASIC that contains various functions of the control unit. However, it is also possible for the interfaces to be separate, integrated circuits or to be at least partially made up of discrete components. In a software implementation, the interfaces may be software modules that are present on a microcontroller in addition to other software modules, for example.

Additionally advantageous is a computer program product having program code, which is stored on a machine-readable medium, such as a semiconductor memory, a hard-disk memory or an optical memory, and is used to implement the method according to one of the specific embodiments described above, when the program is executed in a control unit or a device.

BRIEF DESCRIPTION OF THE DRAWINGS

The present invention is explained in greater detail by way of example, with reference to figures.

DETAILED DESCRIPTION OF EXAMPLE EMBODIMENTS

Figure 1:
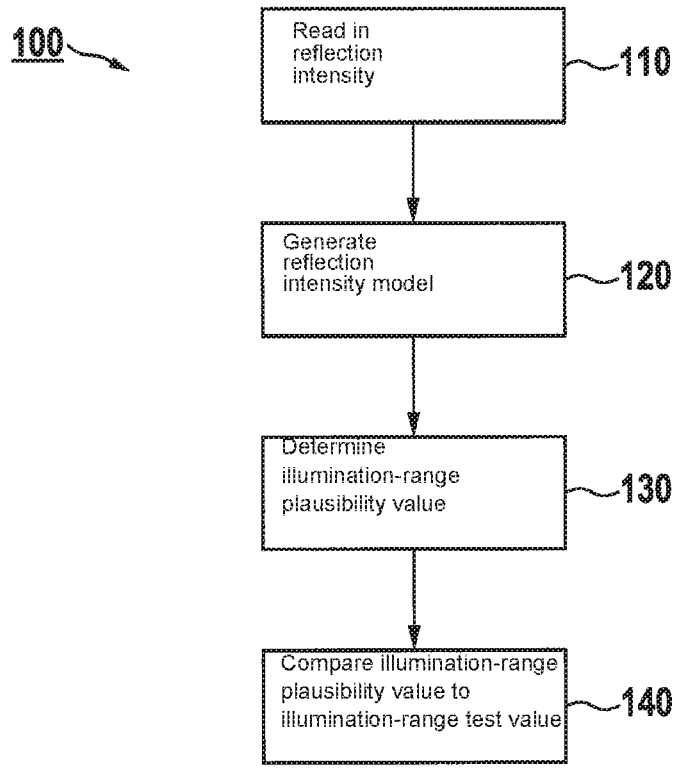
FIG. 1 shows a flow chart of a method for validating an illumination-range test value, according to an exemplary embodiment of the present invention.

In the figures, identical or similar elements may be provided with the same or similar reference numerals and are described only once. In addition, the figures and the description contain numerous features in combination. In this context, these features may also be considered individually or may be combined to form further combinations not explicitly described here. In addition, the present invention is explained in the following description, using different sizes and dimensions; however, the present invention is not to be understood as being limited to these sizes and dimensions. Furthermore, method steps of the present invention may be executed repeatedly, as well as in an order other than that described. If an exemplary embodiment includes an "and/or" conjunction between a first feature/step and a second feature/step, then this can be read to mean that according to a specific embodiment, the exemplary embodiment has both the first feature/the first step and the second feature/the second step, and that according to a further specific embodiment, the exemplary embodiment either has only the first feature/step or only the second feature/step.

FIG. 1 shows a flow chart of an example method 100 for validating an illumination range of a light cone or an illumination-range test value of a light cone of vehicle headlights on the basis of a reflection intensity of traffic-lane markings. In this context, the illumination-range test value may have been ascertained, for example, by a VIR system of a vehicle. In a reading-in step 110, a reflection intensity of a point on a road marking illuminated by one or two headlights of the vehicle is measured or read in. For example, the reflecting road marking may be detected by a camera of the vehicle. Using a suitable algorithm, a reflection intensity value of the point may then be ascertained from the camera image and indicated, for example, in Lux. The reflection intensity value of this point and a measured distance of the point from the vehicle may then be used in a generating step 120 following the reading-in step, in order to generate, in this step 120, a mathematical reflection intensity model for the entire illuminated region of the road marking. The reflection intensity model may be designed, for example, to assign each point on the illuminated region of the road marking a corresponding distance from the vehicle. In a determining step 130 following generating step 120, the reflection intensity model is used for determining an illuminating-range plausibility value, based on a reflection intensity on the road marking that corresponds to a reflection-intensity threshold value. In this context, the reflection-intensity threshold value may be predefined or variable. Finally, in a comparing step 140 following determining step 130, the illumination-range plausibility value is compared to the illumination-range test value, in order to validate it. In particular, the illumination-range test value may be validated when the illumination-range plausibility value is within a tolerance range around the illumination-range test value. Thus, it may be verified, for example, that first of all, the light cone does not extend too far in front of the vehicle, whereby other road users could be blinded, and that secondly, the light cone does not illuminate too small a region in front of the vehicle, whereby a visual range of a driver of the vehicle would be unnecessarily restricted.

Figure 2:
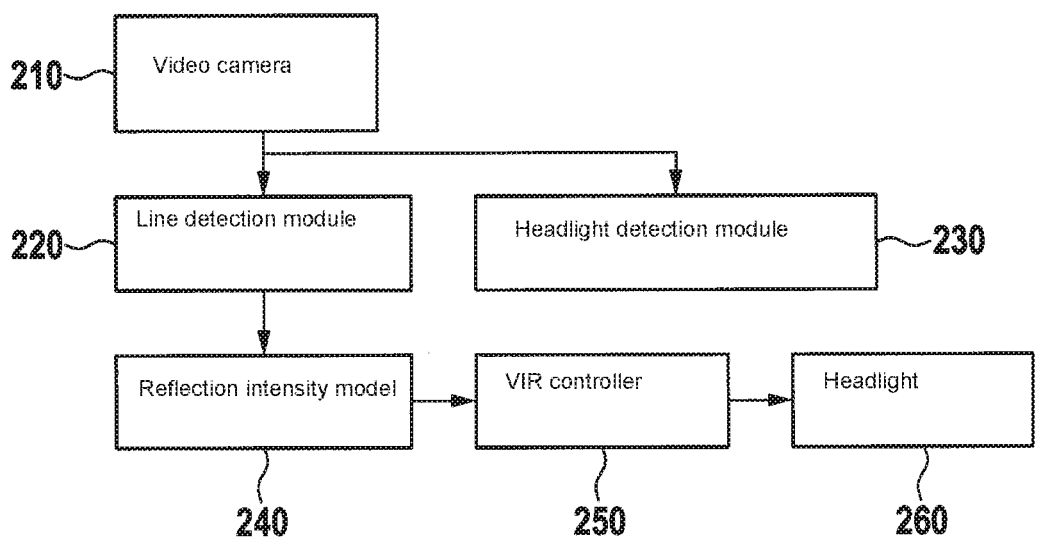
FIG. 2 shows a representation of components of a system for validating an illumination-range test value of a VIR system, according to an exemplary embodiment of the present invention.

FIG. 2 shows a representation of components of a system for validating an illumination-range test value of a VIR system, according to an exemplary embodiment of the present invention. Such a system may be used, for example, in a vehicle while driving at night. A video camera 210, a line detection module 220, a headlight detection module 230, a reflection intensity model 240, a VIR controller 250, as well as one or more headlights 260, are shown. According to the representation in FIG. 2, video camera 210 transmits acquired information about the surrounding area of the vehicle through a suitable interface to line detection module 220, as well as to headlight detection module 230. For example, the information may relate to one or more road markings illuminated by the headlights of the vehicle and/or to headlights of an oncoming vehicle. The information regarding the road marking(s) is processed in line detection module 220 in view of, inter alia, a reflection intensity of, e.g., a point on the (or on a longest detected) road marking in such a manner, that it may be used for generating reflection intensity model 240. In headlight detection module 230, the information about the detected headlights of a separate vehicle are evaluated, for example, with regard to a distance of the separate vehicle and outputted to VIR controller 250 via a suitable interface. Based on the received information, VIR controller 250 determines, for example, an illumination-range test value, via which, e.g., an inclination of headlight(s) 260 is adjusted so that another road user is not blinded. A plausibility value for the illumination-range test value, which plausibility value is ascertained with the aid of reflection intensity model 240, is transmitted to VIR controller 250, for example, via a further, suitable interface, and there, it is compared to the illumination-range test value, so that, for example, the headlight inclination is maintained or adjusted based on a result of the comparison.

The system according to the exemplary embodiment shown in FIG. 2 is made up of a combination of the measured reflection intensity of the road markings and the VIR validation for the VIR control performance or the illumination-range test value. As already described, the system illustrated in FIG. 2 is made up of the above-described components. Video camera 210 picks up the image of the surrounding area in front of the vehicle. An algorithm for line detection 220 detects the individual lines. A second algorithm for headlight detection 230 detects the headlights and/or tail lights of other vehicles. On the basis of the headlights and/or tail lights, VIR controller 250 adjusts the headlight cone, e.g., until it is underneath the bottom edge of the vehicle driving ahead. Line detection 220 and VIR controller 250 may run on one and the same, or else on separate, cameras or control units.

The line intensity model or reflection intensity model, which is based on line detection 220 and has the order n 240, may have, e.g., the shape of a parabola (n=2) and be determined according to the following equation (1):

$$I(x) = -(x-x_0)^n + I_{max} \quad (1)$$

In this context the following applies:
x=longitudinal distance from the vehicle (the origin of the coordinate system is located in the vehicle)
I=intensity of the line reflection of the road marking(s)
$I_{max}$=maximum intensity on the line or longest line
$x_0$=distance at which the maximum intensity on the line is measured
n=order of the model, where only even numbers n=2, 4, 6, 8, . . . are useful.

The assumption of the parabolic model corresponds to the approximation of the illumination of a headlight cone, and its order n may still be varied.

Figure 3:
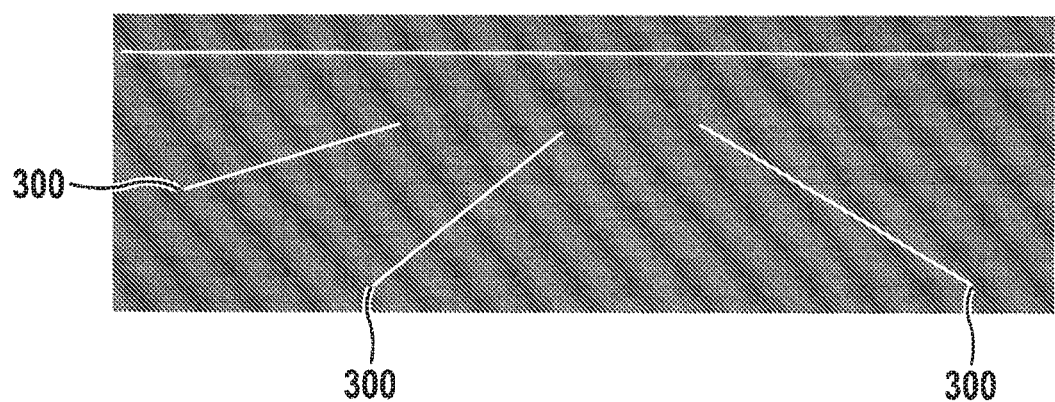
FIG. 3 shows an illustration of reflections of traffic-lane markings in a display.

FIG. 3 shows an illustration of lines 300 identified from a video image. Lines 300 may be, e.g., reflections of road markings on a road. A reflection intensity of road markings 300 may vary over a length of the same, inter alia, as a function of a distance of a particular point on road markings 300 from the vehicle.

The reflection intensity of all of the lines or road markings 300 occurring in the image is extracted from the image shown in FIG. 3 in accordance with the model-based illumination range determination. A reflection intensity model is determined on the basis of the longest line in the image. The intensity of the reflections, i.e., an intensity of a gray-scale value, is measured over the distance from the vehicle, up to the end of line 300. In order to achieve a high degree of robustness of the measured illumination range, only the maximum value of the intensity on line 300 is ascertained. Several mathematical models, which portray the illumination characteristic of the headlights, may be used.

Figure 4:
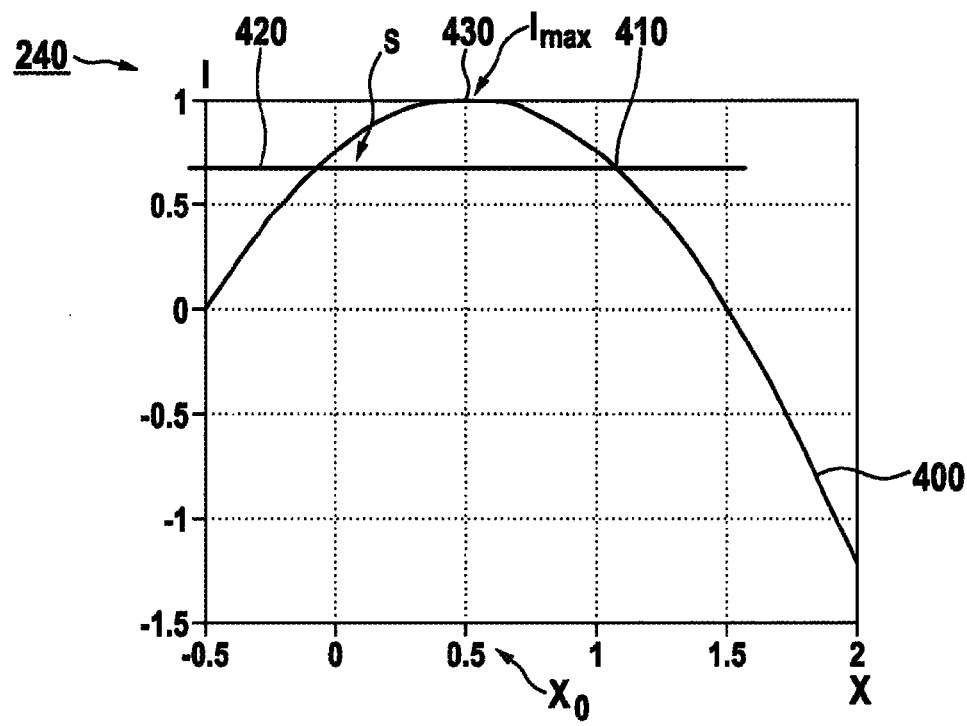
FIG. 4 shows a representation of a reflection intensity model in a coordinate system, according to an exemplary embodiment of the present invention.

According to an exemplary embodiment of the present invention, FIG. 4 shows, in a coordinate system, a representation of a parabolically shaped curve for reflection intensity model 240 according to the equation (1) explained above. A graph of a function 400 in the shape of a parabola, as well as a sectional plane $I_s$ 420, are shown in a coordinate system. Longitudinal distance x from the vehicle, e.g., in meters, is plotted on the abscissa. Reflection intensity I is plotted on the ordinate. In this case, e.g., Lux may be used as a unit. In the coordinate system shown in FIG. 4, values of −0.5 to 2 are plotted on the abscissa, and values of −1.5 to 1 are plotted on the ordinate. Functional graph 400 illustrates a change in the light intensity or reflection intensity I on a road marking as a function of a distance x from the vehicle. The vertex of parabola 400 (i.e., of the functional graph) at $x_0$ 430 marks the maximum reflection intensity $I_{max}$ on the illuminated road marking. Sectional plane $I_s$ runs parallel to the abscissa and intersects graph 400 at a magnitude of a value of approximately 0.6 on the ordinate. The reflection intensity model represented here is determined by measuring $I_{max}$ and $x_0$ and selecting n. It is presently assumed that n has a value of 2. An intersection of sectional plane $I_s$ 420 with functional graph 400 marks a reflection-intensity threshold value 410. Using this, the longitudinal distance x, up to which the headlight illumination extends, may be ascertained. One obtains the model-based line illumination range. Sectional plane $I_s$ may be variable, for example, as a function of a type of headlight used in the vehicle, and may intersect function 400 at a different location. Accordingly, a position of intersection 410 changes with the result of a changed line illumination range.

Figure 5:
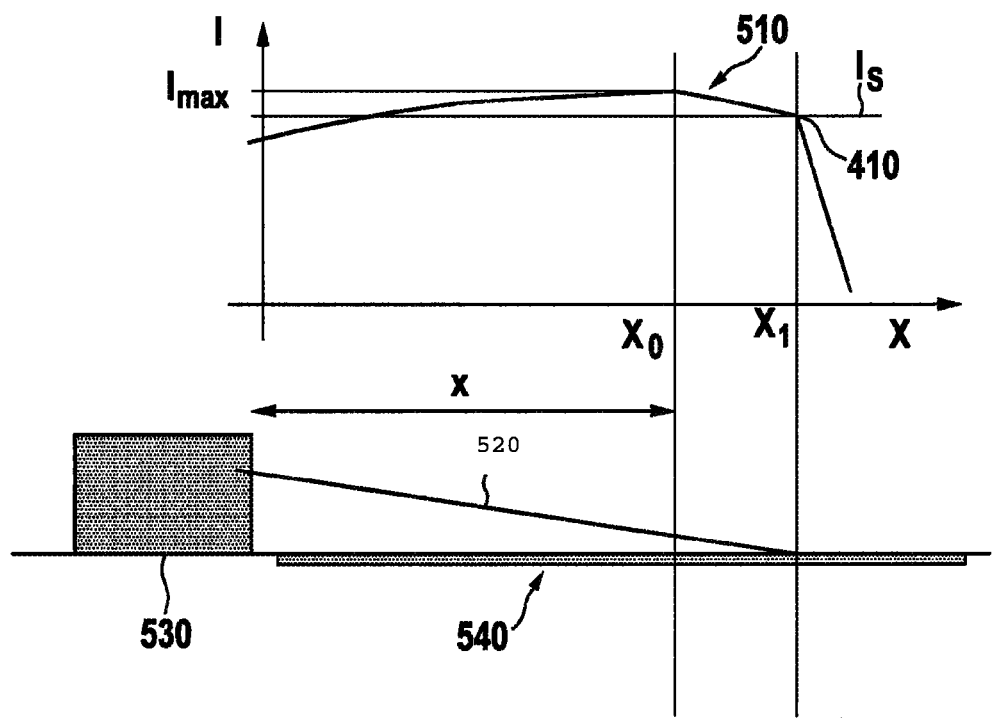
FIG. 5 shows illustrations of a light intensity characteristic according to the reflection intensity model generated, as well as of an illumination range of the headlights on a roadway with the aid a further coordinate system, according to an exemplary embodiment of the present invention.

FIG. 5 shows, using a different coordinate system, a light intensity characteristic 510 and an illumination range 520 of headlights 260 of a vehicle 530 on a roadway, according to an exemplary embodiment of the present invention. Again, longitudinal distance x from the vehicle is plotted on the abscissa of the partial graph represented at the top of FIG. 5, and reflection intensity I is plotted on the ordinate.

The coordinate system illustrates sectional plane $I_s$, as well as light-intensity characteristic function 510, which represents a light intensity characteristic or reflection intensity characteristic according to the reflection intensity model 240 already explained in connection with FIGS. 2 and 4. Furthermore, the passenger car or vehicle 530, a line or road marking 540 and a straight line, which represents illumination range 520 of headlights 260 of vehicle 530, are illustrated in the lower representation in FIG. 5. A perpendicular line intersects function 510 and illumination range 520 at $x_0$ and indicates the point $I_{max}$ on road marking 540. On function 510, a further perpendicular line marks reflection-intensity threshold value 410, at which sectional plane $I_s$ intersects function 510, and as of which reflection intensity I tends sharply towards zero with increasing distance from vehicle 530. Consequently, an intersection point of the further perpendicular line with the abscissa defines an illumination-range plausibility value $x_1$ of the model-based line illumination range. This may optionally be used for validating the VIR control performance or VIR line illumination function in the VIR control (for example, in VIR controller 550). A simple validation may be accomplished by comparing adjusted illumination range 520 to the model-based line illumination range. Measuring errors in the VIR object illumination range may be corrected in this manner. If no object information is available, then the line information may be used as a substitute.

A suitable expansion of today's light functions includes the incorporation of additional, controllable headlight lamps, which only illuminate the lines ahead. In such a system, model-based line illumination range 520 would serve as an actual magnitude of the current line illumination and be used in the separate VIR line controller. These additional headlights may have small lateral transmission angles, since they are oriented only towards the road markings of their own traffic lane and do not have to illuminate the lateral region.

According to the approach set forth here, the optimum illumination range may be ascertained using the reflections on the road marking. Consequently, this is independent of the existence of objects of whatever nature, having possibly unknown reflection characteristics, as well as independent of different roadway subsurfaces having different reflection characteristics. The road markings are particularly suitable for determining the illumination range precisely, using a mathematical reflection model. Therefore, a gap between the idea of obtaining knowledge about the illumination range by measuring the reflection, and a concrete implementation variant, e.g., using an algorithm, which may also be implemented, e.g., in a control unit with the aid of software, is closed.

The methods introduced here, as well as a corresponding control unit, may be used in future headlight control systems.

What is claimed is:

1. A method for controlling a light cone of at least one headlight of a variable illumination range system of a host vehicle, comprising:
   reading in, by an interface, a detected reflection intensity of a point on at least one road surface lane marking illuminated by the light cone, wherein the reflection intensity is detected by a sensor;
   generating, by a control unit including a processor, a reflection intensity model for the road surface lane marking solely based on the detected reflection intensity and a particular distance of the point on the at least one road surface lane marking from the vehicle, the reflection intensity model assigning different reflection intensities to different positions on the road surface lane marking in front of the vehicle;
   determining, by the control unit, an illumination-range plausibility value, at which, according to the reflection intensity model, a reflection intensity is reached, which corresponds to a reflection-intensity threshold value, wherein the reflection-intensity threshold value is a reflection intensity value of a position representing an end point of the light cone away from the at least one headlight;
   comparing, by the control unit, the illumination-range plausibility value to an illumination-range test value to validate the illumination-range test value if the illumination-range plausibility value is inside a tolerance range of the illumination-range test value and maintaining, by the control unit, headlight inclination, wherein the illumination-range test value is a detected distance between the at least one headlight of the host vehicle and one of a headlight or a taillight of a second vehicle situated in the light cone; and
   controlling, by the control unit, the variable illumination range system to adjust the light cone of the at least one headlight of the host vehicle if the illumination-range plausibility value is outside the tolerance range of the illumination-range test value.

2. The method as recited in claim 1, wherein the reflection intensity is measured at a point on the road surface lane marking at which the reflection intensity is at a maximum over all points on the road surface lane marking.

3. The method as recited in claim 1, wherein the reflection intensity is measured of a point which is situated on a longest of a plurality of road surface lane markings illuminated by the light cone.

4. A device for controlling a light cone of at least one headlight of a variable illumination range system of a host vehicle, comprising:
   an interface unit to read in a detected reflection intensity of a point on at least one road surface lane marking illuminated by the light cone, wherein the reflection intensity is detected by a sensor;
   a control unit including a processor configure to:
      generate a reflection intensity model for the road surface lane marking solely based on the detected reflection intensity and a particular distance of the point on the at least one road surface lane marking from the vehicle, the reflection intensity model assigning different reflection intensities to different positions on the road surface lane marking in front of the vehicle;
      determine an illumination-range plausibility value, at which, according to the reflection intensity model, a reflection intensity is reached which corresponds to a reflection-intensity threshold value, wherein the reflection-intensity threshold value is a reflection intensity value of a position representing an end point of the light cone away from the at least one headlight;
      compare the illumination-range plausibility value to an illumination-range test value to validate the illumination-range test value if the illumination-range plausibility value is inside a tolerance range of the illumination-range test value and maintain headlight inclination, wherein the illumination-range test value is a detected distance between the at least one headlight of the host vehicle and one of a headlight or a taillight of a second vehicle situated in the light cone; and
      control the variable illumination range system to adjust the light cone of the at least one headlight of the host vehicle if the illumination-range plausibility value is outside the tolerance range of the illumination-range test value.

5. A non-transitory computer readable medium storing program code to control a light cone of at least one headlight of a variable illumination range system of a host vehicle, the program code, when executed by a processor, causing the processor to perform the steps of:
   reading in, by an interface, a detected reflection intensity of a point on at least one road surface lane marking illuminated by the light cone, wherein the reflection intensity is detected by a sensor;
   generating, by a control unit including a processor, a reflection intensity model for the road surface lane marking solely based on the detected reflection intensity and a particular distance of the point on the at least one road surface lane marking from the vehicle, the reflection intensity model assigning different reflection intensities to different positions on the road surface lane marking in front of the vehicle;
   determining, by the control unit, an illumination-range plausibility value, at which, according to the reflection intensity model, a reflection intensity is reached, which corresponds to a reflection-intensity threshold value, wherein the reflection-intensity threshold value is a reflection intensity value of a position representing an end point of the light cone away from the at least one headlight;
   comparing, by the control unit, the illumination-range plausibility value to an illumination-range test value to validate the illumination-range test value if the illumination-range plausibility value is inside a tolerance range of the illumination-range test value and maintaining, by the control unit, headlight inclination, wherein the illumination-range test value is a detected distance between the at least one headlight of the host vehicle and one of a headlight or a taillight of a second vehicle situated in the light cone; and
   controlling, by the control unit, the variable illumination range system to adjust the light cone of the at least one headlight of the host vehicle if the illumination-range plausibility value is outside the tolerance range of the illumination-range test value.

* * * * *